(12) United States Patent
Gehrke

(10) Patent No.: US 9,756,742 B2
(45) Date of Patent: Sep. 5, 2017

(54) FUNCTIONAL MODULE WITH A HOUSING

(71) Applicant: Euchner GmbH + Co. KG, Leinfelden-Echterdingen (DE)

(72) Inventor: Mike Gehrke, Hochdorf (DE)

(73) Assignee: Euchner GmbH + Co. KG, Leinfelden-Echterdingen (DE)

( * ) Notice: Subject to any disclaimer, the term of this patent is extended or adjusted under 35 U.S.C. 154(b) by 0 days.

(21) Appl. No.: 14/975,717

(22) Filed: Dec. 19, 2015

(65) Prior Publication Data

US 2016/0219724 A1 Jul. 28, 2016

(30) Foreign Application Priority Data

Jan. 27, 2015 (DE) .......................... 10 2015 101 132

(51) Int. Cl.
*H05K 5/00* (2006.01)
*F16P 3/08* (2006.01)
*H01H 27/00* (2006.01)

(52) U.S. Cl.
CPC .............. *H05K 5/0065* (2013.01); *F16P 3/08* (2013.01); *H01H 27/00* (2013.01)

(58) Field of Classification Search
CPC ........................................................ H05K 3/30
USPC ........................................ 361/679.01–679.21
See application file for complete search history.

(56) References Cited

U.S. PATENT DOCUMENTS

| 6,310,305 | B1 | 10/2001 | Kamino et al. | |
| 2009/0244009 | A1* | 10/2009 | Staats | G06F 1/162 345/168 |
| 2009/0277681 | A1* | 11/2009 | Musolf | H04Q 1/10 174/520 |
| 2014/0239647 | A1* | 8/2014 | Jadallah | E05C 19/002 292/140 |

FOREIGN PATENT DOCUMENTS

| DE | 9013198 U1 | 1/1991 |
| EP | 2650993 A2 | 10/2013 |

OTHER PUBLICATIONS

Euchner GmbH: Betriebsanleitung Sicherheitssysteme, Jan. 3, 2015, XP055278921, found in the Internet: URL: https://www.euchner.de/portals/0/siriusmedia/pim/data/210579.pdf (found on Jun. 8, 2016)—p. 13-p. 21, Figures 4, 8-13.

* cited by examiner

*Primary Examiner* — Jerry Wu
(74) *Attorney, Agent, or Firm* — Michael Soderman

(57) ABSTRACT

The invention relates to a functional module with a housing. The housing is comprised of a holder for a submodule. The submodule can be mounted in the holder in two different rotary positions. The submodules of the functional module can be simply mounted on the functional module as independent elements and replaced on it when necessary. This leads, in particular, to a substantial reduction of expenses for repairs, because only the submodule has to be replaced when there is a defect in a submodule, for instance. Different configurations of the functional module are realized with (Continued)

minor effort because of the possibility of attaching the submodule(s) in different rotary positions on the functional module; especially simple adaptation to different applications is possible because of that.

13 Claims, 6 Drawing Sheets

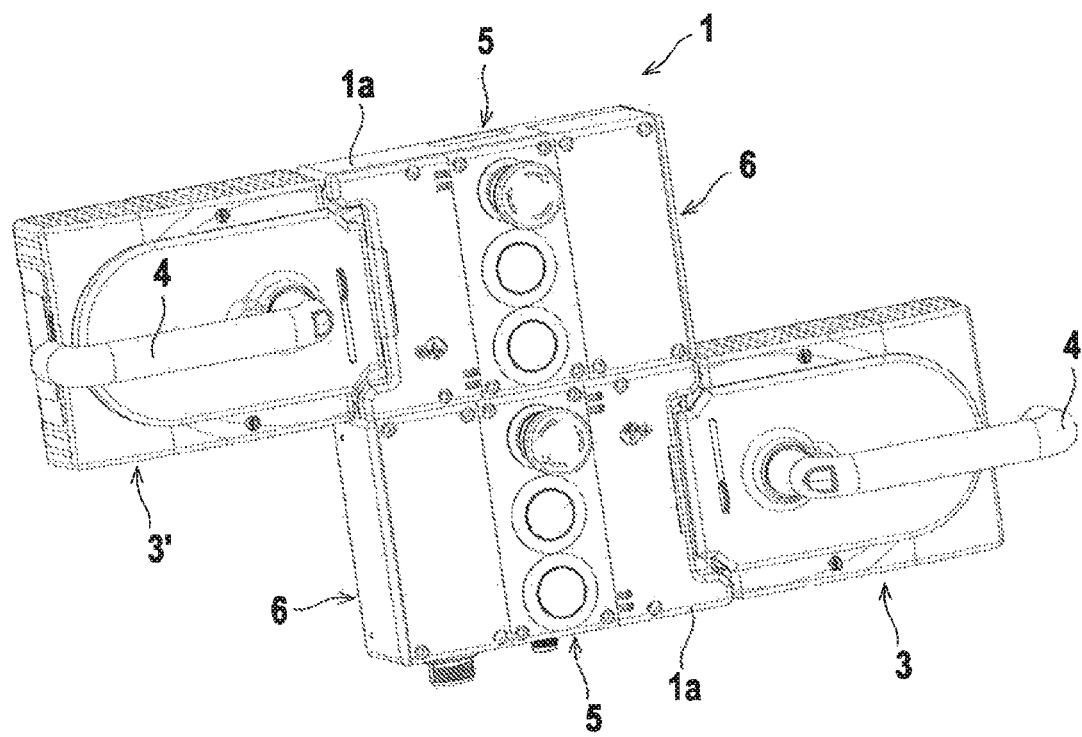
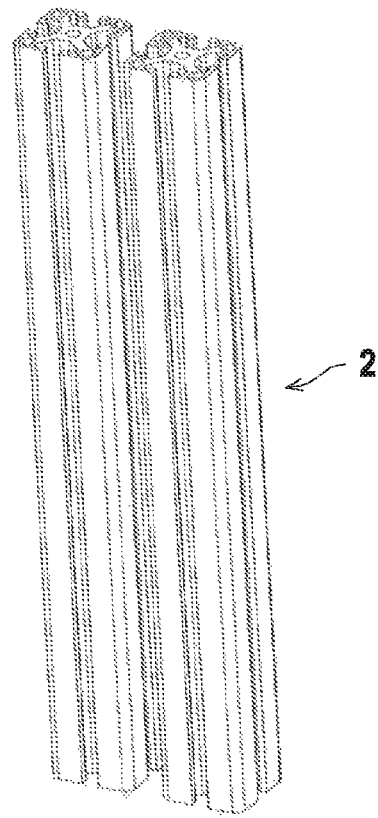
Fig. 1

FUNCTIONAL MODULE WITH A HOUSING

CROSS REFERENCE TO RELATED APPLICATIONS

This application claims the priority of German Application No. DE 10 2015 101 132.8 filed on Jan. 27, 2015; this application is incorporated by reference herein in its entirety.

BACKGROUND

The invention relates to a functional module in accordance with the preamble of claim 1.

Functional modules of the type under discussion generally constitute electronics modules that have specified functionalities.

Functional modules of this type can, as an example, be components of safety systems, in particular locking safety systems. One system of this type is the MGB safety system of the company Euchner, for example. This safety system ensures that movable, separating protective equipment is reliably kept closed, in particular protective doors, and that access is consequently secure to fenced-in, hazardous areas that are critical for safety.

This locking safety system is comprised of a locking module that is arranged on a handle module. These modules serve to reliably keep the protective door closed. The door handle of the handle module can be held in the closed position via spring force and unlocked via magnetic force. Alternatively, the door handle can be held in the closed position via magnetic force and unlocked via spring force.

The functionality of the locking module can be expanded by having additional submodules, for instance a button module as a control unit.

A first drawback of a locking safety system of this type is that the entire locking safety system has to be sent back to the manufacturer for repair purposes when a defect arises.

Another drawback of the locking safety system is that the construction expenses for an adaptation to different configurations are undesirably high. Different configurations especially arise via different arrangements of the protective door relative to the locking safety system. An arrangement of the handle module has to be provided on the right-hand side or on the left-hand side of the locking module depending on the arrangement of the protective door. To cover these configurations, different variants of the locking module have to be provided that have the different designs for an attachment of the handle module on the right-hand side or on the left-hand side.

SUMMARY

The invention relates to a functional module with a housing. The housing is comprised of a holder for a submodule. The submodule can be mounted in the holder in two different rotary positions.

DETAILED DESCRIPTION

The invention is based on the problem of providing a functional module of the type mentioned at the outset that has a high level of functionality with a simple design.

The elements of claim 1 are specified to solve this problem. Advantageous embodiments and useful design developments of the invention are described in the dependent claims.

The invention relates to a functional module with a housing. The housing is comprised of a holder for a submodule. The submodule can be mounted in the holder in two different rotary positions.

A first important advantage of the invention is that the submodules of the functional module can be simply mounted on the functional module as independent elements and replaced on it when necessary. This leads, in particular, to a substantial reduction of expenses for repairs, because only the submodule has to be replaced when there is a defect in a submodule, for instance.

Another important advantage of the invention is that different configurations of the functional module are realized with minor effort because of the possibility of attaching the submodule(s) in different rotary positions on the functional module; especially simple adaptation to different applications is possible because of that.

The fact that the submodule can be mounted in the holder in two rotary positions rotated by 180° with respect to one another is especially advantageous.

If multiple submodules are provided on the functional module, all of the submodules can be expediently mounted in two rotary positions rotated by 180° on the functional module.

The mounting of a submodule in different rotary positions is made possible in an especially advantageous way in terms of the design because the submodule has rotationally invariant electrical connectors that can make contact in an identical way in both of the rotary positions of the submodule with electrical connectors in the housing of the functional module.

It is especially advantageous that the connectors of the submodule(s) can be connected to the connectors of the locking module and released from them again without tools. The submodule, or each submodule, can be electrically connected to the locking module in a quick and simple way in the different installation positions because of that.

The connectors can be designed as plug-in connecting terminals for this.

Alternatively, spring contacts can be provided as connectors.

It is especially advantageous when the connectors in the housing are connected to a data bus.

The bus lines of the data bus are laid in a circuit board arranged in the housing here.

The data bus forms an internal bus system that enables communication of the components of the functional module and all submodules independently of external bus systems. Expensive wiring within the locking module is no longer necessary because of the design of the data bus in such a way that the bus lines are routed in the circuit boards of the modules. This advantage is reinforced by the fact that the connectors of the submodules can be directly brought into contact on the circuit boards.

In accordance with an advantageous design form of the invention, the functional module is designed to be a locking module of a safety system, in particular a locking safety system. A laterally opening latch holder for a handle module is provided on the housing of the locking module.

The locking module, as a submodule, conveniently has a connection submodule and a button submodule. The connection submodule serves to provide a connection to external units; the button submodule has control elements in the form of buttons with which different functions of the safety system can be activated or deactivated.

The locking module can, because its submodules can be mounted on it in two rotary positions rotated by 180°, be used for its part in two rotary positions rotated by 180° with respect to one another; the submodules have the same arrangement in both of the rotary positions. One and the same locking module can therefore serve to hold a right-hand and a left-hand handle module; two variants of the safety system can be realized with minor construction expense because of that.

In accordance with a further advantageous design form of the invention, the functional module has connection modules to connect other modules; the connection modules are designed as plugs or sockets.

The locking module can therefore be expanded into a modular arrangement made up of modules. The connection modules advantageously form a modular system; the connection modules can be exchangeably mounted on the functional module or the other modules.

The modular arrangement can therefore have an especially flexible design.

BRIEF DESCRIPTION OF THE DRAWINGS

The invention will be explained with the aid of the drawings below. The following are shown in the figures:

FIG. 1: Two variants of a safety system with a locking module and an associated handle module.

DETAILED DESCRIPTION OF THE PREFERRED EMBODIMENT

FIG. 1 shows an example of the functional module in the form of a locking module 1 as per the invention. The locking module 1 is a component of a safety system, specifically of a locking safety system. The locking module 1 can, as shown in FIG. 1, be used in two rotary positions rotated by 180° with respect to one another and is fastened to a profile rail 2 in these rotary positions. A right-hand handle module 3 is arranged on the locking module 1 in the first rotary position of the locking module. A left-hand handle module 3' is arranged on the locking module 1 in the second rotary position of the locking module. Each handle module 3, 3' has a door handle 4.

The locking module 1 and the handle module 3, 3' form a functional unit that ensures that a protective door or the like is safely kept closed. The door handle 4 can kept in the closed position with spring force in principle and unlocked via magnetic force. In the instant case, the door handle 4 is kept in the closed position via magnetic force that is generated via magnets arranged in the locking module 1 and unlocked via spring force.

Figure 2:
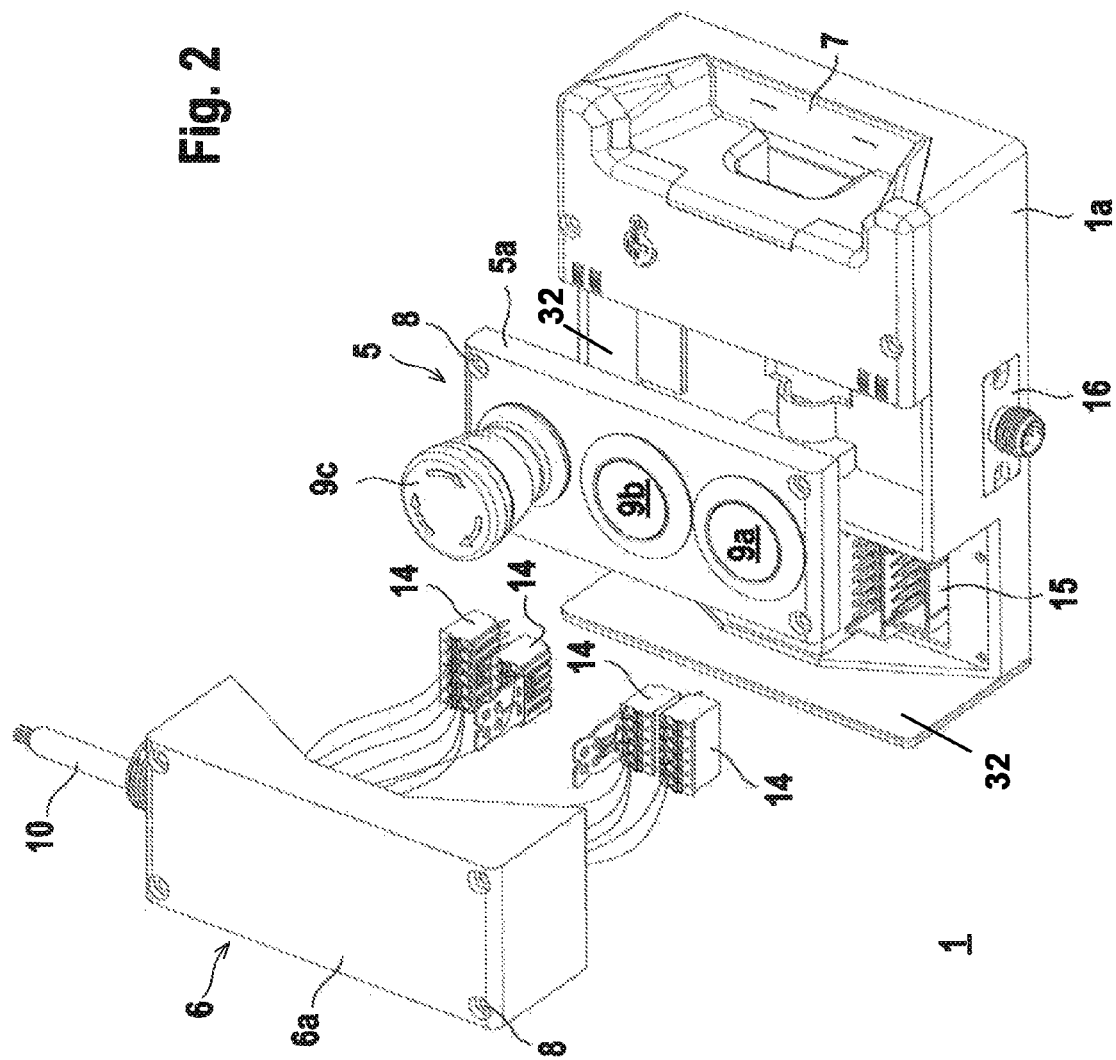
FIG. 2: Locking module in accordance with FIG. 1 in a first rotary position.
Figure 3:
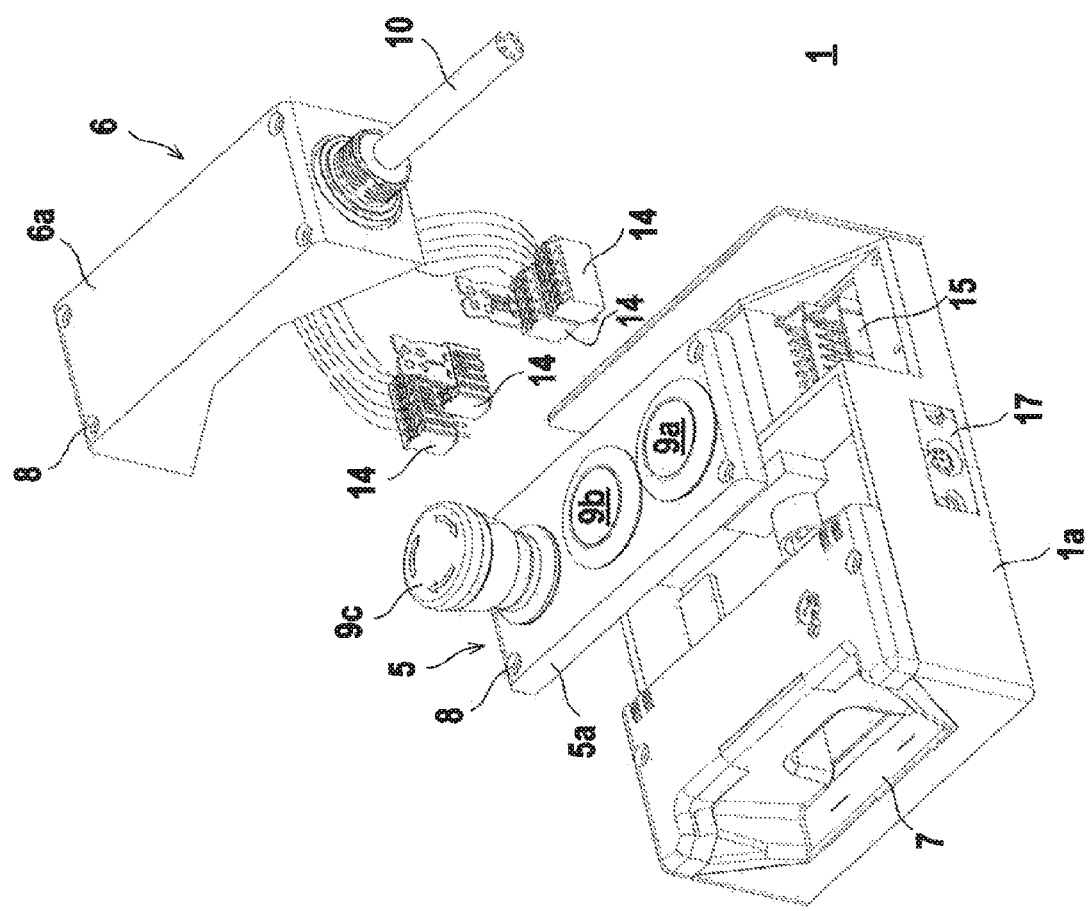
FIG. 3: Locking module in accordance with FIG. 1 in a second rotary position.

The locking module 1 has a first functional module in the form of a button submodule 5 and a second functional module in the form of a connection submodule 6. FIG. 1 shows the submodules in the respective installed state in the locking module 1. FIGS. 2 and 3 show the locking module 1 in a detailed drawing with removed submodules in each case.

FIG. 2 shows the locking module 1 in a first rotary position in which a latch holder 7 is on the right-hand side to hold the right-hand handle module 3. FIG. 3 shows the locking module 1 in a second rotary position rotated by 180° with respect to the first rotary position, in which the latch holder 7 is on the left-hand side to hold the left-hand handle module 3'.

The components of the locking module 1 are integrated into a housing 1a. As FIGS. 2 and 3 show, the housing 1a has recesses that form the holders for the button submodule 5 and the connection submodule 6. The button submodule 5 and the connection submodule 6 each have a housing part. The housing 1a of the locking module 1 is completely closed after these housing parts are inserted into the recesses. The housing part of the button submodule 5 is designed in the form of a button submodule cover 5a. The housing part of the connection submodule 6 is designed in the form of a connection submodule housing 6a. Both the connection submodule housing 6a and the button submodule cover 5a have holes 8 through which fastening screws, which are not shown, can be inserted to fasten them to the housing 1a.

The button submodule 5 has, as control elements for the locking module 1, several buttons 9a, 9b, in particular an emergency stop button 9c as well. The buttons 9a, 9b are provided on the front of the button submodule cover 5a. The connection submodule 6 serves to provide a connection to external units, for instance an external bus system, and has a cable outlet 10 for this that opens out laterally on the connection submodule housing 6a.

Figure 4:
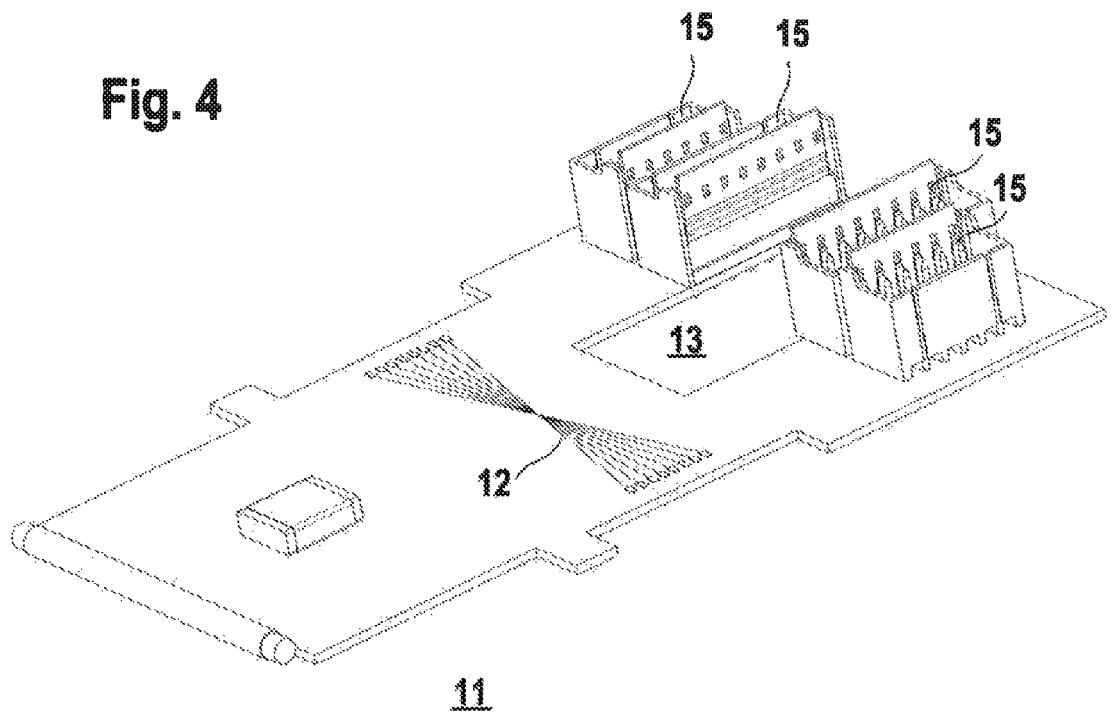
FIG. 4: Circuit board for the locking module of FIGS. 1 to 3.

A circuit board 11 that is shown in a detailed drawing in FIG. 4 is arranged in the interior of the locking module 1. Bus lines 12 of a data bus that is designed in the form of a CAN bus in the instant case are laid in the circuit board 11. The data bus forms an internal bus system that operates independently of external bus systems. Internal communication of all of the components of the locking module 1 and its submodules takes place over the data bus. The circuit board 11 has a cutout area 13 into which the magnet for locking the handle module 3 can be inserted.

In accordance with the invention, the submodules, meaning the button submodule 5 and the connection submodule 6, are designed in such a way that they can be mounted on the locking module 1 in two rotary positions rotated by 180° with respect to one another in each case. For one thing, the button submodule cover 5a and the connection submodule housing 6a of the submodules are designed to be rotationally symmetric with respect to a rotation of 180° for this. Furthermore, both of the submodules also have electrical connectors to provide a connection to connectors of the locking module 1 that are likely rotationally symmetric with respect to a rotation by 180°.

With regard to the button submodule 5, the connectors can be designed as an example in the form of spring contacts, which are not shown and which are arranged on the bottom of the button submodule cover 5a, and which can make contact with contact elements of the circuit board 11, which are likewise not shown.

The connection submodule 6 has electrical connectors in the form of connecting terminals 14 that can create contact via simple mounting with connection parts 15 on the circuit board 11; these connection parts 15 are designed in the form of counterparts to the connecting terminals 14.

Because of the rotational symmetry of the submodules, they can be mounted on the locking module 1 in both rotary positions of the locking module in such a way that the submodules have exactly the same position with respect to a base as the profile rail 2 in both of the rotary positions of the locking module 1.

The locking module 1 as per the invention can be expanded into a modular arrangement with several modules. Connection modules that are designed in the form of plugs 16 or sockets 17 can be integrated on opposite sides of the housing 1a of the locking module 1 for this.

The modular arrangement can then be comprised of several locking modules 1. In general, separate connection modules or button modules can also be connected as modules. Communication of all of the modules expediently takes place over the data bus; the individual modules are connected to this data bus via the connection modules.

Figure 5:
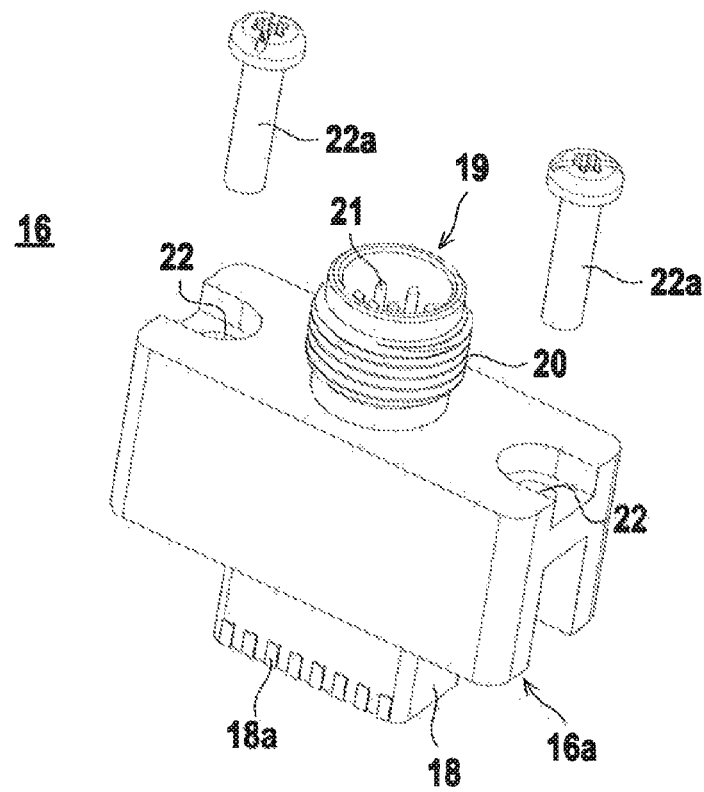
FIG. 5: Embodiment of a plug as a connection module for the locking module of FIGS. 1 to 3.
Figure 6:
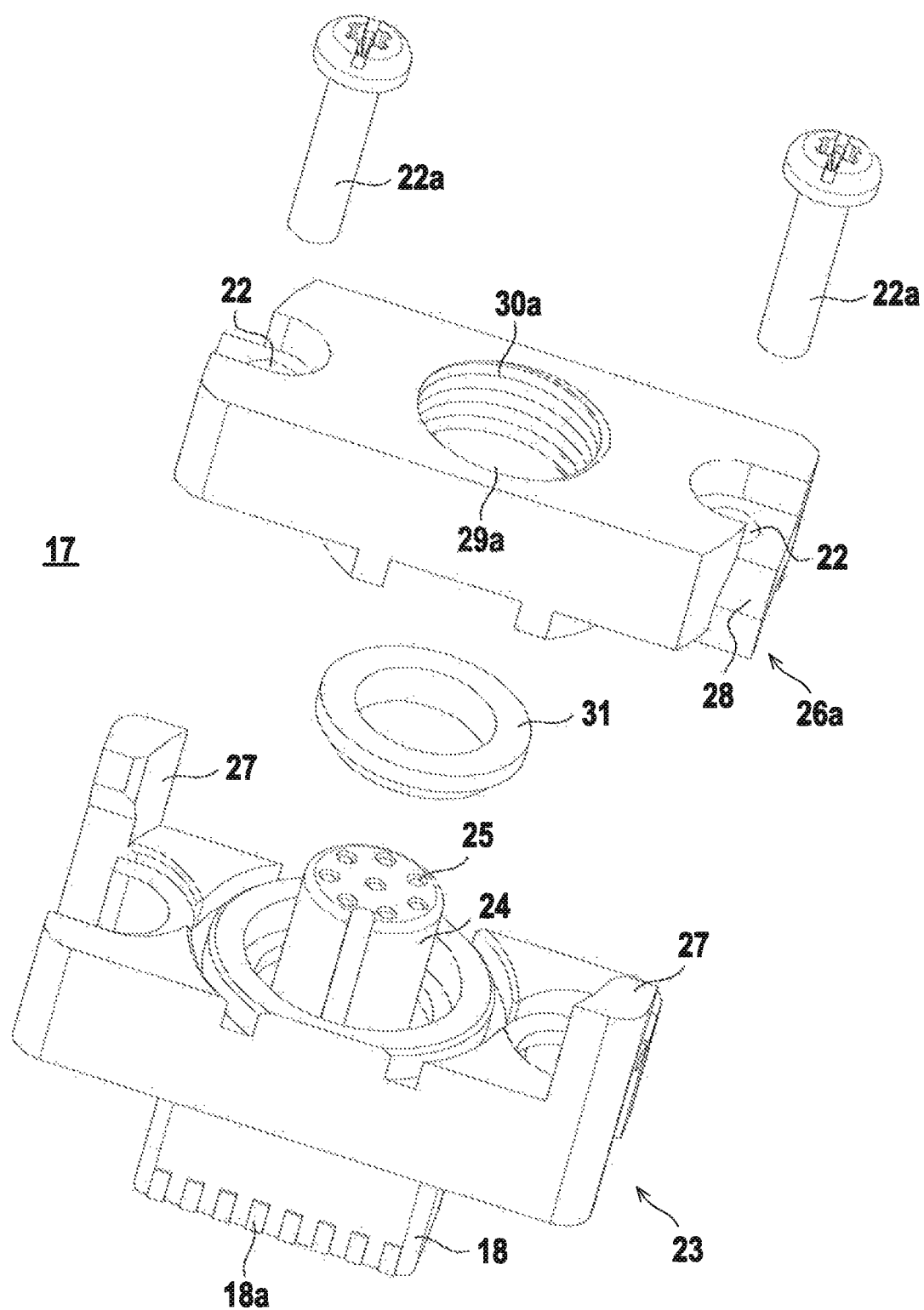
FIG. 6: First variant of a socket as a connection module for the locking module of FIGS. 1 to 3.
Figure 7:
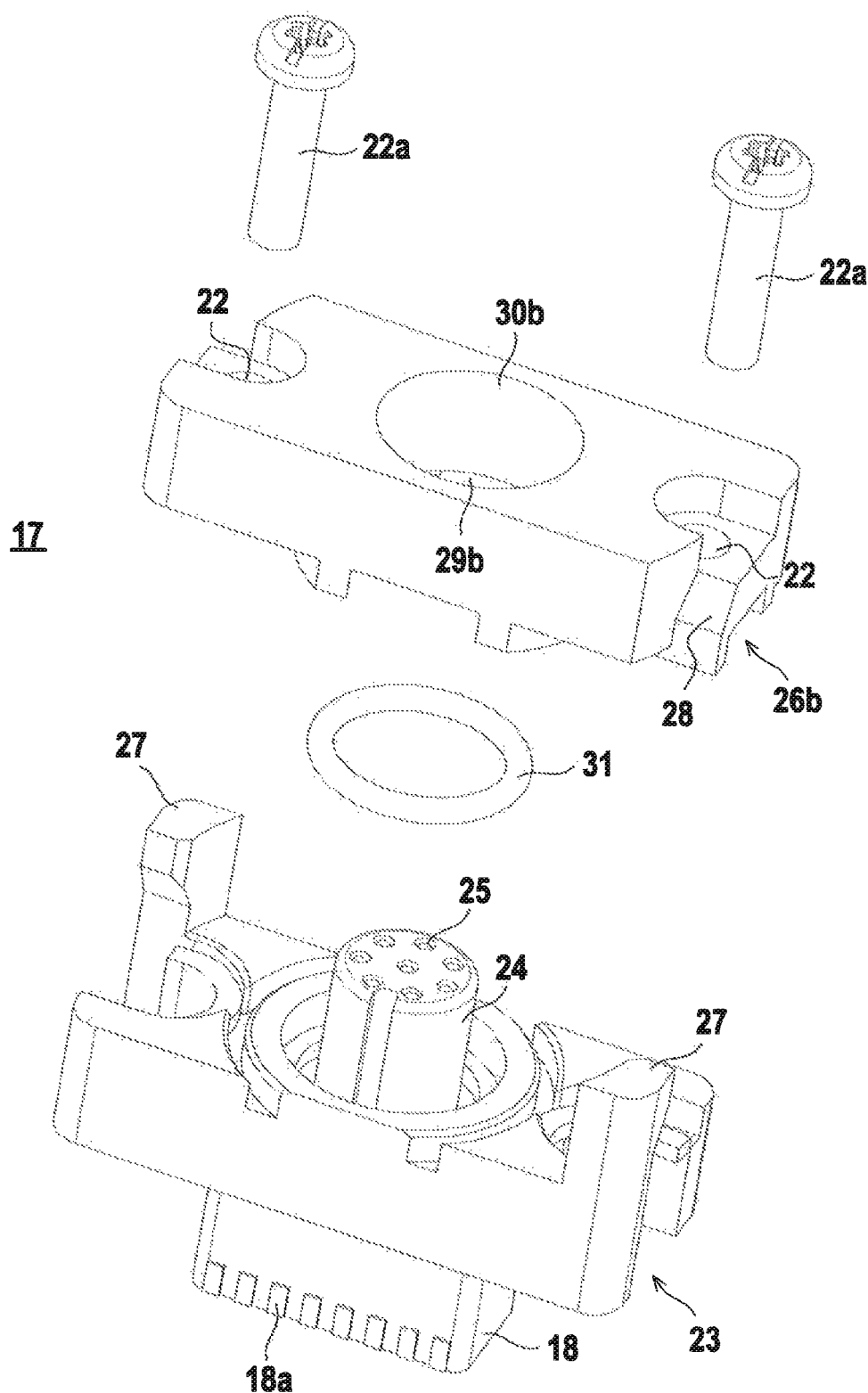
FIG. 7: Second variant of a socket as a connection module for the locking module of FIGS. 1 to 3.

FIGS. 5 to 7 show a detailed view of the design of the connection modules for the locking module 1 of FIGS. 1 to 3. FIG. 5 shows an embodiment of a plug 16. The plug 16 has a plug base body 16a; the contact interface 18 comes out on the bottom of it. The contact interface 18 has spring contacts 18a; contact can be made with them to contact pads of the circuit board 11 in the locking module 1. A connection component 19 comes out at the top; it constitutes a standard M12 interface in this case. The connection component 19 is designed as a hollow cylinder and has an external thread 20 on the outside, which is an M12 thread in this case. There are several contact pins 21 in the interior of the connection component 19. The plug base body 16a has two lateral mounting holes 22 through which screws 22a can be inserted to fix the plug 16 in place on the locking module 1.

Two variants of a socket 17 that are shown in FIGS. 6 and 7 are assigned to the plug 16 in accordance with FIG. 5. The socket 17 has a base body 23 identical for both variants; the contact interface 18 with the spring contacts 18a is provided on the bottom of it, corresponding to the design of the plug 16. A cylindrical connection part 24 with contact elements 25 in the form of contact holes into which the contact pins 21 of the plug 16 are inserted is located on the top of the base body 23.

Two different upper parts 26a, 26b that are shown in FIGS. 6 and 7 are assigned to the base body 23 to create two different socket variants. Both of the upper parts 26a, 26b have the same external contour, so a choice of one of the upper parts 26a, 26b can be put on the base body 23. To fix these parts in place, the base body 23 has projections 27 that can be put on cutouts 28 in the upper parts 26a, 26b that are designed to be complementary with regard to this. Furthermore, the upper parts 26a, 26b have two lateral mounting holes 22, analogous to those of the plug 16, into which the screws 22a can be inserted so as to be able to fix the socket 17 in place on the locking module 1 or another module.

The upper parts 26a, 26b differ with regard to the design of central holes 29a, 29b that surround the connection part 24 of the base body 23 with play when the upper part 26a, 26b is put on the base body 23. The hole 29a of the upper part 26a bordered with an internal thread 30a, whereas the hole 29b of the upper part 26b is bordered with a smooth wall element 30b of the upper part 26a, 26b.

The corresponding upper part 26a, 26b is put on the base body 23 with a seal 31 in the form of an O ring to form the socket 17.

Sockets 17 with different functionality are obtained in accordance with the differently designed holes 29a, 29b. Cable plugs and the like can be screwed into the socket 17 with the upper part 26a in accordance with FIG. 6. On the other hand, the socket 17 with the upper part 26b in accordance with FIG. 7 is put on the plug 16 in accordance with FIG. 5; the wall element 30b surrounding the hole 29b then surrounds the connection component 19 of the plug 16 with a slight amount of play.

LIST OF REFERENCE NUMERALS (1) Locking module
(1a) Housing
(2) Profile rail
(3, 3') Handle module
(4) Door handle
(5) Button submodule
(5a) Button submodule cover
(6) Connection submodule
(6a) Connection submodule housing
(7) Latch holder
(8) Hole
(9a, 9b) Button
(9c) Emergency stop button
(10) Cable outlet
(11) Circuit board
(12) Bus line
(13) Cutout area
(14) Connecting terminal
(15) Connection part
(16) Plug
(16a) Plug base body
(17) Socket
(18) Contact interface
(18a) Spring contact
(19) Connection component
(20) External thread
(21) Contact pin
(22) Mounting hole
(22a) Screws
(23) Base body
(24) Connection part
(25) Contact element
(26a, 26b) Upper part
(27) Projection
(28) Cutout area
(29a, 29b) Hole
(30a) Internal thread
(30b) Wall element
(31) Seal
(32) Submodule holder

The invention claimed is:

1. A locking module of a safety system with a housing, wherein the housing comprises a laterally opening latch holder and one or more submodule holders for one or more button submodules, wherein the one or more button submodules are mounted in the one or more submodule holders, the one or more button submodules are mounted in either a first rotary position or in a second rotary position rotated by 180° with respect to the first rotary position in the one or more submodule holders, and the one or more button submodules have rotationally invariant first electrical connectors that can make contact in an identical way in both the first rotary position and the second rotary position of the one or more button submodules with second electrical connectors in the housing of the locking module; and a right-hand handle module can be mounted on the laterally opening latch holder in a first rotational position of the locking module and that a left-hand handle module can be fixed in place on the laterally opening latch holder in a second rotational position of the locking module that is rotated by 180° with respect to the first rotational position.

2. The locking module according to claim 1, wherein the second electrical connectors in the housing are connected to a data bus.

3. The locking module according to claim 2, wherein bus lines of the data bus are laid in a circuit board arranged in the housing.

4. The locking module according to claim 1, wherein the first electrical connectors and the second electrical connectors are designed in the form of plug-in connecting terminals.

5. A locking module of a safety system with a housing, wherein the housing comprises one or more submodule holders for one or more connection submodules, wherein the one or more connection submodules are mounted in the one or more submodule holders, the one or more connection submodules are mounted in either a first rotary position or in a second rotary position rotated by 180° with respect to the first rotary position in the one or more submodule holders, and the one or more connection submodules have rotationally invariant first electrical connectors that can make contact in an identical way in both the first rotary position and the second rotary position of the one or more connection submodules with second electrical connectors in the housing of the locking module; and a laterally opening latch holder for a door handle module is provided on the housing of the locking module.

6. The locking module according to claim 5, wherein the second electrical connectors in the housing are connected to a data bus.

7. The locking module according to claim 6, wherein bus lines of the data bus are laid in a circuit board arranged in the housing.

8. The locking module according to claim 5, wherein the first electrical connectors and the second electrical connectors are designed in the form of plug-in connecting terminals.

9. The locking module according to claim 5, wherein spring contacts are provided as first electrical connectors and second electrical connectors.

10. The locking module according to claim 5, wherein a right-hand handle module can be mounted on the laterally opening latch holder in a first rotational position of the locking module and that a left-hand handle module can be fixed in place on the laterally opening latch holder in a second rotational position of the locking module that is rotated by 180° with respect to the first rotational position.

11. The locking module according to claim 5, wherein said one or more connection modules provide a connection to other modules, and wherein said one or more connection modules are designed to be plugs (16) or sockets (17).

12. The locking module according to claim 11, wherein said one or more connection modules form a modular system, wherein said one or more connection modules can be mounted in an exchangeable fashion on the locking module or on other modules.

13. A locking module of a safety system with a housing, wherein the housing comprises one or more first submodule holders for one or more button submodules and one or more second submodule holders for one or more connection submodules, wherein the one or more button submodules are mounted in the one or more first submodule holders and the one or more connection submodules are mounted in the one or more second submodule holders, the one or more button submodules are mounted in either a first rotary position or in a second rotary position rotated by 180° with respect to the first rotary position, the one or more connection submodules are mounted in either a third rotary position or in a fourth rotary position rotated by 180° with respect to the first rotary position, and the one or more button submodules have rotationally invariant first electrical connectors that can make contact in an identical way in both the first rotary position and the second rotary position of the one or more button submodules with second electrical connectors in the housing of the locking module, and the one or more connection submodules have rotationally invariant third electrical connectors that can make contact in an identical way in both the third rotary position and the fourth rotary position of the one or more connection submodules with fourth electrical connectors in the housing of the locking module.

* * * * *